US011169004B2

(12) United States Patent
Kühn

(10) Patent No.: US 11,169,004 B2
(45) Date of Patent: Nov. 9, 2021

(54) INDUCTIVE SENSOR FOR MEASUREMENT DEVICE

(71) Applicant: Pepperl+Fuchs GmbH, Mannheim (DE)

(72) Inventor: Thomas Kühn, Mannheim (DE)

(73) Assignee: PEPPERL+FUCHS SE, Mannheim (DE)

( * ) Notice: Subject to any disclaimer, the term of this patent is extended or adjusted under 35 U.S.C. 154(b) by 153 days.

(21) Appl. No.: 16/663,624

(22) Filed: Oct. 25, 2019

(65) Prior Publication Data

US 2020/0132510 A1    Apr. 30, 2020

(30) Foreign Application Priority Data

Oct. 25, 2018   (DE) ...................... 10 2018 126 644.8

(51) Int. Cl.
    *G01D 5/20*     (2006.01)
(52) U.S. Cl.
    CPC .................................... *G01D 5/202* (2013.01)
(58) Field of Classification Search
    CPC ..... H03K 2217/96038; H03K 17/9547; G01V 3/102; H03B 5/04; G01D 5/202
    USPC .................................................... 324/207.16
    See application file for complete search history.

(56) References Cited

U.S. PATENT DOCUMENTS

2004/0150412 A1    8/2004 Hayashi et al.
2015/0233853 A1*   8/2015 Seefried ............. H03K 17/9542
                                                  324/655

FOREIGN PATENT DOCUMENTS

FR          2581200 A1    10/1986
WO       2016141965 A1     9/2016

OTHER PUBLICATIONS

Kuhn; Translation of WO 2016/141965; Sep. 15, 2016; EPO & Google (Year: 2016).*
European Search Report for Patent Application EP 19 20 2730.8 dated Feb. 26, 2020.
German Search Report from Patent Application 10 2018 126 644.8 dated Mar. 29, 2019.

* cited by examiner

*Primary Examiner* — Judy Nguyen
*Assistant Examiner* — Rahul Maini
(74) *Attorney, Agent, or Firm* — Gregory L. Mayback; Dickinson Wright PLLC

(57) ABSTRACT

An inductive sensor, particularly for a proximity sensor, includes a resonance circuit including a sensing coil and an amplifier comprising a first gain stage and a second gain stage each coupled via respective adjusting elements with the resonance circuit to inject energy for maintaining an oscillation of the resonance circuit. The first gain stage provides a substantially linear amplification and the second gain stage provides a comparator characteristics.

8 Claims, 2 Drawing Sheets

INDUCTIVE SENSOR FOR MEASUREMENT DEVICE

CROSS-REFERENCE TO RELATED APPLICATIONS

This application claims the priority, under 35 U.S.C. § 119(a)-(d), to German Patent Application No. 10 2018 126 644.8, filed Oct. 25, 2018; the prior applications are herewith incorporated by reference in their entirety.

STATEMENT REGARDING FEDERALLY SPONSORED RESEARCH OR DEVELOPMENT

Not Applicable

FIELD OF THE INVENTION

The present invention relates to inductive sensors having an oscillator with at least one sensing coil and an amplifier with an adjustable gain. Particularly, the present invention relates to measures to adapt the characteristics of the amplifier to increase sensitivity of the inductive sensor in a reproducible manner.

BACKGROUND OF THE INVENTION

Inductive sensors are generally used to detect a change of inductivity or a change of energy loss in a magnetic field caused by various physical effects. Particularly, inductive sensors are commonly applied for proximity sensors where the presence, non-presence of a conductive object in or movement of a conductive object within or through a sensing range shall be detected.

Inductive sensors often have an oscillator including a resonance circuit formed with a sensing coil and a capacitor. During operation the oscillator oscillates while the sensing coil produces an alternating magnetic field which may substantially be affected by the presence of conductive objects. Therefore, conductive objects which enter or leave a sensing range of the sensing coil or move in or out of the sensing range produce a change of an energy loss of the magnetic field generated by the sensing coil.

During operation the resonance circuit has a resonance frequency which is determined by the inductance of the sensing coil and by the capacitance of the capacitor. By means of a feedback amplification, the resonance circuit is excited so that the oscillation is maintained by injecting energy in phase with the oscillation.

Further, the presence of an object in the sensing range leads to a decrease of a quality factor of the sensing coil caused by an energy loss due to the production of eddy currents in the object. In operation this results in a change of oscillation frequency of the excited oscillation and in a change of the amplitude of oscillation.

In applications where the presence, non-presence or movement of objects shall be detected often the amplitude variation is analyzed. Therefore, the characteristics of the feedback amplification is usually configured to obtain a high sensitivity of the amplitude with respect to a change of resonance characteristics due to the presence of an object in the sensing range.

Further, the amplification usually is made linear providing an almost constant gain in the operation point for normal operation. However, if the gain characteristics of the amplification is too flat (constant amplification), the recovery time to bring the oscillation back to the operating point after a substantial attenuation, may be too long for a given application. Therefore, in a detuned operation mode, which may e.g. occur during a start-up phase of the inductive sensor or when an object provides a high attenuation of the resonance circuit, the amplification needs to provide a very high gain to quickly bring the operation back to the operating point with a stable oscillation. Therefore, there are two concurrent goals which have to be met which is usually made by customizing the gain characteristics of the amplification.

Adapting gain characteristics of amplifiers is well known in the art. Usually non-linear semiconductor effects are used to form the gain characteristics. However, that introduces a high temperature dependency and suffers from a low reproducibility so that the application in inductive sensors, such as proximity sensors, is not appropriate. Furthermore, those non-linear gain characteristics based on semiconductor effects cannot be easily tuned.

Substantially, it is desirable to provide an inductive sensor which can be configured with appropriate gain characteristics and with a high independency with respect to temperature and component variations.

An oscillating sensor and a measurement device are provided which substantially have a high sensitivity with respect to objects entering a sensing range, a high signal-to-noise ratio, a high adaptability towards differing environmental and component tolerances.

SUMMARY OF THE INVENTION

The inductive sensor provides the measurement device and the proximity sensor device.

According to a first aspect, an inductive sensor, particularly for a proximity sensor, is provided, comprising:
  a resonance circuit including a sensing coil;
  an amplifier comprising a first gain stage and a second gain stage each coupled with the resonance circuit via respective adjusting elements to inject energy for maintaining an oscillation of the resonance circuit,
wherein the first gain stage provides a substantially linear amplification and the second gain stage provides a comparator characteristics.

The above inductive sensor substantially has a resonance circuit and an amplifier. The resonance circuit has a sensing coil which in oscillation operation produces an alternating magnetic field in a sensing range. Conductive objects entering the sensing range of the sensing coil will reduce the energy of the oscillation in the resonance circuit (quality factor) due to the generation of eddy currents in the objects.

The amplifier excites the resonance circuit by a feedback coupling of the amplified oscillation signal. So, one output of the amplifier is fed back to the resonance circuit to compensate the energy loss due to an attenuation caused by parasitic effects and by objects in the sensing range. The amplifier is therefore configured to inject energy into the resonance circuit so that for each attenuation a specific oscillation with an amplitude and frequency characteristics for the attenuation is set. By applying a near to constant amplification, the oscillation amplitude is made strongly depending on the quality factor of the oscillation, i.e. on the quality factor of the sensing coil affected by an object in the sensing range.

Secondly, an amplified oscillator signal is provided by the amplifier for a further analyzing and for deriving the sensor signal therefrom.

As mentioned before, for a stable operation of the inductive sensor the open loop gain characteristics (open loop gain versus input voltage in open loop state) of the oscillator needs to be shaped. To provide an open loop gain characteristics of the oscillator which has a substantially constant gain in the operating range and a high gradient of the open loop gain for the oscillator being strongly detuned, the amplifier includes a first gain stage having a substantial constant gain, i.e. a linear behavior, and a second gain stage having a comparator characteristics, i.e. having a very high gain so that it substantially acts like a comparator. Basically, the comparator characteristics allows to amplify small voltages by driving the second gain stage into saturation with respect to its output.

First and second gain stages are coupled in parallel with the resonance circuit, while the outputs of the gain stages are fed back to the resonance circuit in an adjusted weighted manner. This allows to set a defined open loop gain characteristics of the oscillator which is mainly determined by the adjusting elements by which the two gain stages are feedback-coupled with the resonance circuit. Herein, the term "open loop" defines a cut-off of the feedback connection from an output of the amplifier and the resonance circuit to the input of the amplifier which serves as a model for characterization of the oscillator. The open loop gain is defined as the gain resulting from a ratio of the voltage amplitude of the oscillation at the resonance circuit and a variable amplitude at the amplifier input for an open loop condition.

Furthermore, the gain stage with a linear amplification and the gain stage with comparator characteristics can be provided with a high temperature stability and with low tolerances, e.g. as an operational amplifier and/or a comparator.

Furthermore, the adjusting elements may be formed with resistors, while the gain characteristics of the amplifier can be shaped depending on the linear gain factor of the first gain stage and by setting the ratio between the resistances of a first resistor by which the first gain stage may be coupled with the resonance circuit and the resistance of a second resistor by which the second gain stage may be coupled with the resonance circuit. These resistors can be used to tune the inductive sensor.

Particularly, at least one of the adjusting elements may be formed with an electronic switch.

A calibration unit may be configured to control the at least one of the electronic switches, particularly by means of a pulse width modulated signal, to set an effective resistance.

According to an embodiment, the resonance circuit may have a capacitor forming a parallel resonance circuit with the sensing coil.

Moreover, adjustment elements may be coupled with the same or different nodes of the resonance circuit.

According to a further aspect an inductive sensor device, particularly a proximity sensor, may comprise the above inductive sensor, wherein a signal analyzer is configured to receive an amplified oscillation signal at the output of the first gain stage and to provide a sensor signal indicative of the amplitude of an oscillation signal of the resonance circuit.

BRIEF DESCRIPTION OF THE DRAWINGS

Embodiments are described in more detail in conjunction with the accompanying drawings in which.

DETAILED DESCRIPTION OF THE EMBODIMENTS

Figure 1:
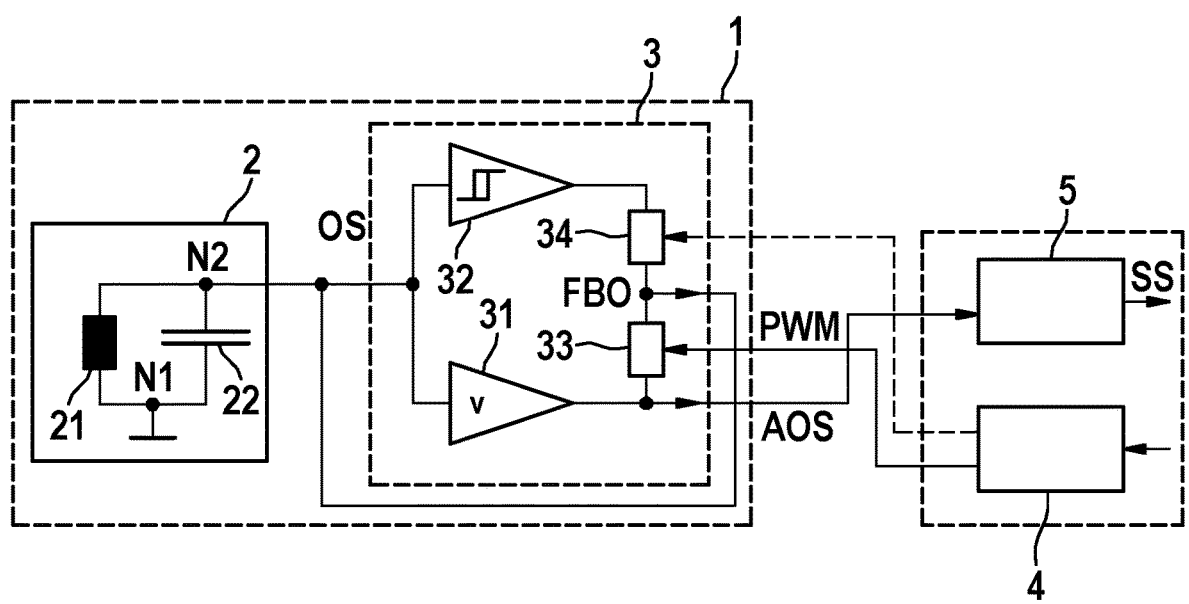
FIG. 1 schematically shows an inductive sensor having a resonance circuit and an amplifier.

FIG. 1 schematically shows a sensor circuitry (inductive sensor) 1 for an inductive sensor device such as a proximity sensor. The sensor circuitry 1 includes a resonance circuit 2, an amplifier 3 and a calibration unit 4. In the inductive sensor device an amplified oscillator signal AOS is fed to a signal analyzer 5 to obtain an electrical sensor signal SS. Alternatively, an oscillation signal may be fed to the signal analyzer 5.

The oscillator 2 may be configured as a parallel resonance circuit including a sensing coil 21 and a capacitor 22. A first node N1 of the oscillator 2 is coupled with ground potential, while a second node N2 of the oscillator 2 is coupled with an input of the amplifier 3 to provide an oscillator signal to the amplifier 3.

The amplifier 3 has a first gain stage 31 providing a substantially constant gain and the second gain stage 32 providing a very high gain. The first gain stage 31 is substantially implemented as a linear amplifier which can be build using an operation amplifier or the like. The output of the first gain stage 31 is coupled via a first adjusting element 33 to an amplifier feedback output FBO which is connected with the resonance circuit 2 in a feed-forward coupling scheme. The feed-forward coupling scheme allows to in-phase-couple the amplifier feedback output FBO of the amplifier 3 with the resonance circuit 2 to provide an excitation for the oscillation.

The second gain stage 32 is configured to bring the output of the second gain stage 32 in saturation already with small oscillator signals at its input. So, the second gain stage 32 substantially acts as a comparator where the provided gain substantially depends on the amplitude of the (input) oscillation signal OS. Saturation means a constant output of the second gain stage 32 once the input voltage is above/below a predetermined value.

Furthermore, the output of the second gain stage 32 is coupled via a second adjusting element 34 to the amplifier feedback output FBO. The adjusting elements 33, 34 allow to adjust the impacts of the first and second gain stage 31, 32 on the feedback to the resonance circuit 2. Preferably, the first and second adjusting elements 33, 34 may be formed by first and second resistors. Therefore, by calibrating the resistances of the first and second resistor, the gain characteristics of the amplifier 3 can be adjusted. Other components as adjusting elements 33, 34 can be used for setting the adjustment alternatively or additionally to the first and second resistor, such as capacitors or inductivities.

When the resonance circuit 2 is used as a sensing element for sensing the presence of the conductive object within a sensing perimeter of the sensing coil 21, the oscillation amplitude varies over the quality factor of the resonance circuit of the resonance circuit 2. By coupling the amplifier feedback output FBO to the resonance circuit 2, an operating point is set where the amplification gain is 1 in a steady state operation, while the oscillation amplitude varies with the quality factor of the resonance circuit 2.

The output of the first gain stage 31 can be coupled to a signal analyzer 5 wherein an amplitude of the amplified oscillation signal AOS is determined. This may include rectification of the amplified oscillation signal AOS and applying the rectified amplified oscillation signal AOS to an amplitude determination unit to obtain an indication of the amplitude of the oscillation signal OS. The indication of the amplitude of the oscillation signal OS may be output as a corresponding sensor signal SS. Therefore, while using the customized gain characteristics of the amplifier 3 for feedback controlling the oscillation of the resonance circuit 2, the amplified oscillation signal can be tapped from the amplifier 3 as the output of the first gain stage 31. If a frequency shall be determined as well, the output of the second gain stage 32 is preferable, as it provides the oscillation signal with a high amplitude.

The first and second resistors 33, 34 can be provided as fixed resistances, however at least the first resistor 33 can be implemented with a series of a resistor and an electronic switch, e.g. by means of an active component such as a MOSFET, to be controlled by the calibration unit 4. The calibration unit 4 may control the electronic switch by applying a pulse width modulated (PWM) signal with a duty cycle which determines the effective resistance of the electronic switch. Setting the electronic switch can be used to calibrate the amplifier 3, e.g. to customize the gain characteristics of the amplifier 3.

Gain stages with a constant gain and a very high gain with a saturation limit are easy to implement in a reproducible and temperature-independent manner, such as with operational amplifiers, comparators or the like. If the first gain stage 31 is dominant with respect to the second gain stage 32, the respective gain may be between 1.25 and 8, more preferred between 1.5 and 4, for instance about 2, as the voltage divider network has a gain of about 0.5 in resonance for maximum sensitivity. The gain of the second gain stage 32 in the non-saturated operation range can be more than 1000.

Figure 2:
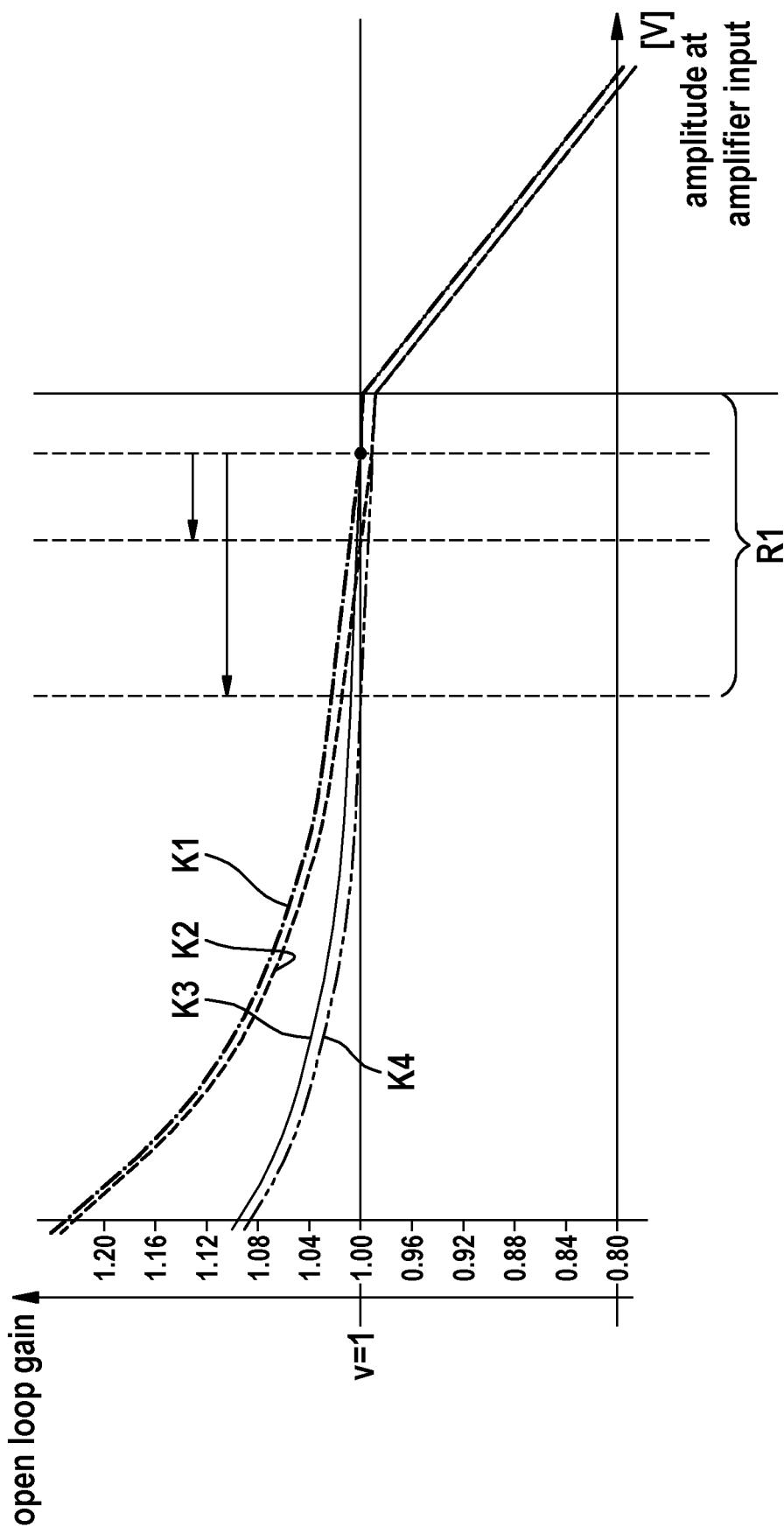
FIG. 2 shows a diagram illustrating an open loop gain characteristics of the oscillator versus the amplitude at the amplifier input for different settings and with and without a detectable object within the sensing area.

FIG. 2 shows a diagram illustrating an open loop gain characteristics indicating the open loop gain of the oscillator for input signals of different amplitudes. In other words, the diagram shows the characteristics of the ratio of the voltage amplitude of the oscillation at the resonance circuit 2 and a variable amplitude at the amplifier input over the amplitude at the amplifier input. It can be seen that there is a quasi-linear operating range R1 (substantially horizontal part) in which a substantially constant amplification of the oscillation signal shall occur. Substantially constant amplification may include a slight slope of the amplification needed or sufficient to ensure a stable operating point. The sensor circuitry 1 can be set to operate in the operating range by calibration of the first resistor, e.g. by means of a variable resistor (resistor network with PWM-controlled electronic switch) controlled by the calibration unit 4.

The diagram shows four curves wherein the curves K1, K2 and the curves K3, K4 represent different calibration settings obtained by different resistances of the resistors 33, 34. The curves K1 and K2 show the open loop gain characteristics for a first calibration setting for a situation without an object in the sensing area and with an object in the sensing area, respectively.

The curves K3 and K4 show for a second calibration setting the situations where an object is not in the sensing area and where an object is in the sensing area of the sensing coil 21. The gain characteristics is shown for an open loop circuit, while when the oscillation signal of the resonance circuit 2 is connected to the input of the amplifier 3 (closed loop), a closed loop gain of 1 will be achieved.

The amplified oscillation signal AOS can be tapped at the output of the first gain stage 31 which supplies the amplified oscillation signal OS.

In general, above configuration allows to obtain high amplitude variation depending on small changes of energy losses in the magnetic field produced by the sensing coil 21. Further the feedback characteristics of the amplifier 3 can be carefully set by adjusting the first and/or second resistor 33, 34. In addition, by adjusting the effective resistance of the first resistor 33 a gain of about 2 (or of a gain between 1.5 and 4) for the oscillation signal OS can be obtained at the output of the first gain stage 31 for further signal processing by the signal analyzer 5.

The invention claimed is:

1. An inductive sensor for proximity sensing, comprising:
a resonance circuit including a sensing coil;
an amplifier comprising a first gain stage and a second gain stage each coupled via respective adjusting elements with the resonance circuit for maintaining an oscillation of the resonance circuit,
wherein,
the first gain stage provides a substantially linear amplification and the second gain stage provides comparator characteristics; and
the first gain stage and the second gain stage are coupled so that an open-loop gain characteristic has constant gain in the operating range and a high gradient for the resonance circuit being detuned.

2. The inductive sensor according to claim 1, wherein the adjusting elements are formed with resistors.

3. The inductive sensor according to claim 2, wherein at least one of the adjusting elements includes an electronic switch.

4. The inductive sensor according to claim 3, wherein a calibration unit is configured to control the at least one of the electronic switches, particularly by means of a pulse width modulated signal, to set an effective resistance of the respective adjusting element.

5. The inductive sensor according to claim 1, wherein the resonance circuit has a capacitor forming a parallel resonance circuit with the sensing coil.

6. The inductive sensor according to claim 1, wherein the adjustment elements are coupled with the same or different nodes of the resonance circuit.

7. An inductive proximity sensor, comprising the inductive sensor according to claim 1, and further comprising a signal analyzer configured to receive an amplified oscillation signal at the output of the first gain stage and to provide a sensor signal indicative of the amplitude of an oscillation signal of the resonance circuit.

8. An inductive proximity sensor, comprising the inductive sensor according to claim 1, and further comprising a signal analyzer configured to receive an oscillation signal at the output of the resonance circuit and to provide a sensor signal indicative of the amplitude of the oscillation signal of the resonance circuit.

* * * * *